United States Patent
Chan et al.

(10) Patent No.: US 10,579,290 B2
(45) Date of Patent: Mar. 3, 2020

(54) OPTION CODE PROVIDING CIRCUIT AND PROVIDING METHOD THEREOF

(71) Applicant: Winbond Electronics Corp., Taichung (TW)

(72) Inventors: Johnny Chan, Taichung (TW); Chi-Shun Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 235 days.

(21) Appl. No.: 15/077,916

(22) Filed: Mar. 23, 2016

(65) Prior Publication Data

US 2017/0277465 A1 Sep. 28, 2017

(51) Int. Cl.
*G06F 3/06* (2006.01)
*G11C 13/00* (2006.01)
*G11C 17/16* (2006.01)

(52) U.S. Cl.
CPC .......... *G06F 3/0629* (2013.01); *G06F 3/0604* (2013.01); *G06F 3/0679* (2013.01); *G11C 13/004* (2013.01); *G11C 13/0069* (2013.01); *G11C 17/165* (2013.01)

(58) Field of Classification Search
CPC ..... G06F 3/0629; G06F 3/0604; G06F 3/0679
See application file for complete search history.

(56) References Cited

U.S. PATENT DOCUMENTS

| | | | | |
|---|---|---|---|---|
| 4,546,456 A | * | 10/1985 | Buie | G11C 17/00 365/227 |
| 7,457,152 B2 | * | 11/2008 | Lee | G11C 11/5678 365/163 |
| 7,586,776 B2 | | 9/2009 | Oh et al. | |
| 10,353,823 B2 | * | 7/2019 | Brokish | G06F 12/1009 |
| 2005/0228980 A1 | * | 10/2005 | Brokish | G06F 21/575 713/2 |
| 2007/0217273 A1 | * | 9/2007 | Choi | G11C 29/027 365/200 |
| 2008/0049535 A1 | | 2/2008 | Nishimura | |

(Continued)

FOREIGN PATENT DOCUMENTS

| | | |
|---|---|---|
| CN | 101169970 | 4/2008 |
| CN | 102246240 | 11/2011 |

(Continued)

OTHER PUBLICATIONS

"Search Report of Europe Counterpart Application", dated Jul. 24, 2017, p. 1-p. 8, in which the listed references were cited.

(Continued)

*Primary Examiner* — Paul M Knight
(74) *Attorney, Agent, or Firm* — JCIPRNET

(57) ABSTRACT

An option code providing circuit includes a plurality of resistive random access memory cells and a controller. The controller determines whether to provide a control signal to operate a heavy forming operation on the resistive random access memory cells or not. Wherein, the controller performs a read operation on the resistive random access memory cells to determine a bit number of the resistive random memory cell which is heavy formed, and the option code is determined by the bit number of resistive random access memory cell which is heavy formed or a bit number of the resistive random access memory cell which is not heavy formed.

11 Claims, 3 Drawing Sheets

(56) References Cited

U.S. PATENT DOCUMENTS

| | | | |
|---|---|---|---|
| 2008/0149912 A1* | 6/2008 | Nakai | G11C 11/005 257/5 |
| 2009/0065760 A1* | 3/2009 | Lee | H01L 45/1253 257/4 |
| 2009/0172321 A1* | 7/2009 | Scheuerlein | G06F 11/1415 711/161 |
| 2009/0272961 A1* | 11/2009 | Miller | H01L 21/265 257/4 |
| 2010/0106953 A1* | 4/2010 | Morad | G06F 8/66 713/2 |
| 2011/0069530 A1 | 3/2011 | Sekine et al. | |
| 2011/0208905 A1* | 8/2011 | Shaeffer | G11C 16/10 711/103 |
| 2011/0222330 A1* | 9/2011 | Lee | G11C 13/0004 365/100 |
| 2012/0033512 A1 | 2/2012 | Takase | |
| 2012/0182783 A1* | 7/2012 | Bedeschi | G11C 13/0002 365/148 |
| 2014/0025907 A1 | 1/2014 | Fujinami et al. | |
| 2014/0133211 A1* | 5/2014 | Nazarian | G11C 7/062 365/145 |
| 2014/0153315 A1 | 6/2014 | Kwon et al. | |
| 2015/0085561 A1 | 3/2015 | Maeda et al. | |
| 2015/0131361 A1* | 5/2015 | Chu | G11C 29/027 365/148 |
| 2015/0184283 A1* | 7/2015 | Tendulkar | C23C 14/5806 204/192.21 |
| 2015/0378801 A1* | 12/2015 | Navon | G06F 11/076 714/704 |
| 2016/0077958 A1* | 3/2016 | Hsu | G11C 7/20 711/103 |

FOREIGN PATENT DOCUMENTS

| | | |
|---|---|---|
| CN | 103871462 | 6/2014 |
| CN | 104423896 | 3/2015 |
| JP | H04283498 | 10/1992 |
| JP | H11338765 | 12/1999 |
| JP | 2006155710 | 6/2006 |
| JP | 2009043389 | 2/2009 |
| JP | 2009134828 | 6/2009 |
| JP | 2015064918 | 4/2015 |
| TW | I463309 | 12/2014 |

OTHER PUBLICATIONS

"Office Action of Japan Counterpart Application," dated Aug. 8, 2017, p. 1-p. 6, in which the listed references were cited.

"Office Action of Taiwan Counterpart Application," dated Mar. 31, 2017, p. 1-p. 8, in which the listed references were cited.

* cited by examiner

OPTION CODE PROVIDING CIRCUIT AND PROVIDING METHOD THEREOF

BACKGROUND

Field of the Invention

The invention relates to an option code providing circuit and providing method thereof. Particularly, the invention relates to an option code providing circuit and providing method thereof by using resistive random access memory cells.

Description of Related Art

In recently years, consumer electronic products are necessary tools in daily use for people. For storing information, a plurality of memory apparatuses are embedded in the electronic products. For storing non-volatile information, a so-called resistive random access memory (RRAM) is getting more popular.

In conventional art, for programming or erasing a RRAM cell, a reset or set operation should be operated on the RRAM cell. But, in physical use, the resistance of the RRAM cell which has been set or reset may be varied for some reason. That is, the data retention requirement can't be met. Especially, for providing an option code, if the data retention requirement can't be met, a wrong function or wrong application may be executed, and the performance of a system is reduced. Such as that, it is important to meet the data retention requirement for providing the option code by using the RRAM cell.

SUMMARY OF THE INVENTION

The invention is directed to an option code providing circuit and providing method thereof, which proves at least one of a plurality of RRAM cell to be heavy formed to guarantee the data retention.

The invention provides an option code providing circuit. The option code providing circuit includes a plurality of resistive random access memory cells and a controller. The controller is coupled to the resistive random access memory cells. The controller determines whether to provide a control signal to operate a heavy forming operation on at least one of the resistive random access memory cells or not. Wherein, the controller performs a read operation on the resistive random access memory cells to determine a bit number of the resistive random memory cell which is heavy formed, and the option code is determined by the bit number of the resistive random access memory cell which is heavy formed or a bit number of the resistive random access memory cell which is not heavy formed.

The invention also provides an option code providing method. The step of the option code providing method includes: determining whether to provide a control signal to operate a heavy forming operation on a plurality of resistive random access memory cells; performing a read operation on the resistive random access memory cells to determine a bit number of the resistive random memory cell which is heavy formed; and, generating the option code according to the bit number of the resistive random access memory cell which is heavy formed or a bit number of the resistive random access memory cell which is not heavy formed.

According to the above descriptions, in the invention, the option code is generated by detecting a bit number of the resistive random access memory cell which is heavy formed, and the option code can be adjusted by operating heavy forming operation on at least one of the resistive random access memory cells. Such as that, the resistance of the at least one of the resistive random access memory cells which is heavy formed can be hold on a stable value. The data retention of the option code can be guaranteed.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
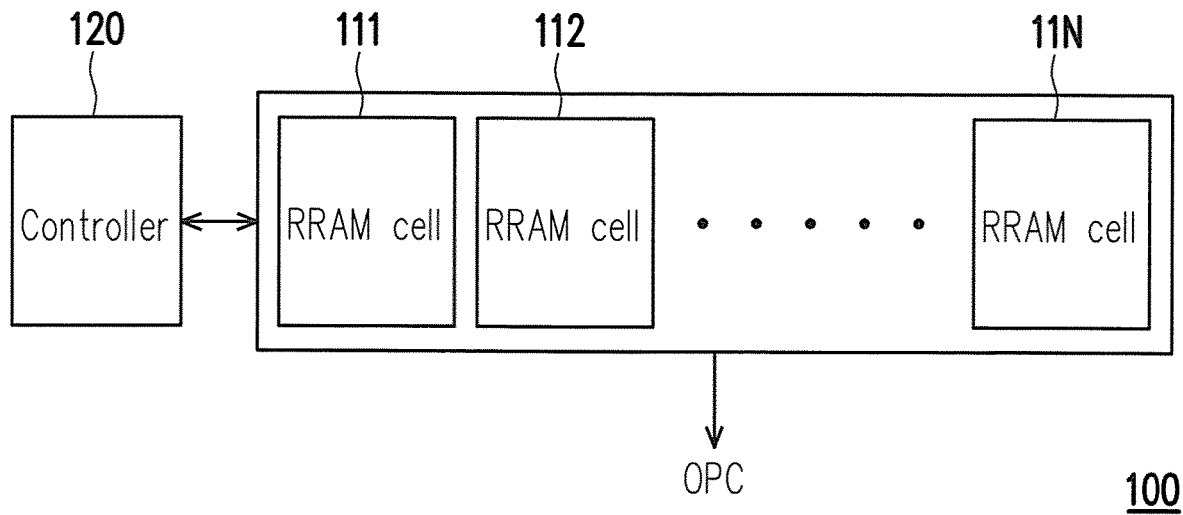
FIG. 1 illustrates a block diagram of an option code providing circuit according to an embodiment of present disclosure.

Referring to FIG. 1, FIG. 1 illustrates a block diagram of an option code providing circuit according to an embodiment of present disclosure. The option code providing circuit 100 includes a plurality of resistive random access memory (RRAM) cells 111-11N and a controller 120. The RRAM cells 111-11N are coupled to the controller 120. To provide an option code OPC, the controller 120 performs a read operation on the plurality of RRAM cells 111-11N and measures the cell current. When any RRAM cells 111-11N is heavy formed, the resistance of the heavy formed RRAM cell is reduced to a very small value, and high cell current larger than a pre-set threshold current value will be measured from at least one of the heavy form RRAM cells 111-11N. The option code OPC is then determined by a bit number of the RRAM cells 111-11N which are heavy formed. In detail, if the bit number of the heavy formed RRAM cells is even, i.e. 0, 2, 4, . . . , the option code OPC is a first logic value, and on the contrary, if the bit number of the heavy formed RRAM cells is odd, i.e., 1, 3, 5, . . . , the option code OPC is a second logic value. In one embodiment, the first logic value may be logic value "0" and the second logic value may be logic value "1". Or, in another embodiment, the first logic value may be logic value "1" and the second logic value may be logic value In other embodiments, the option code OPC may be determined by a bit number of the RRAM cells 111-11N which are not heavy formed. When any RRAM cells 111-11N is not heavy formed, the resistance of the not heavy formed RRAM cell is kept at a normal value, and a cell current smaller than a second pre-set threshold current value will be measured from at least one of the un-heavy formed RRAM cells 111-11N.

In the present embodiment, no RRAM cells 111-11N is heavy formed at the beginning and the default bit number of heavy formed RRAM cells is 0. The option code OPC is determined to be the first logic value. To adjust the option code OPC, the controller 120 may transmit a control signal to at least one of the RRAM cells 111-11N to operate a heavy forming operation on the at least one of the RRAM cells 111-11N. If a read operation is operated on the RRAM cells 111-11N, high cell current will be measured from the heavy formed RRAM cells and low cell currents will be measured from the rest RRAM cells which are not heavy formed. The bit number of the heavy formed RRAM cells 111-11N is varied and the option code OPC code is then adjusted. It should be noted here, the heavy forming operation is a one-time strong writing operation and a good data retention characteristic of the option code providing circuit 100 can be obtained.

For an application example, the default bit number of the RRAM cells which are heavy formed equals to 0 (even), and the option code with logic value "0" (first logic value). To adjust the option code OPC to logic value "1" (second logic value), the controller 120 may perform a heavy forming operation on the RRAM cell 111. After the RRAM cell 111 is heavy formed, the bit number of the heavy formed RRAM cells equals to 1 (odd), and the option code OPC with logic value "1" may be provided. Moreover, to adjust the option code OPC to logic value "0" again, the controller 120 may further perform the heavy forming operation on the RRAM cell 112. After both of the RRAM cells 111 and 112 are heavy formed, the bit number of the heavy formed RRAM cells equals to 2 (even), and the option code OPC with logic value "0" may be provided.

Of course, the option code OPC may be adjusted again by performing the heavy forming operation on one of the RRAM cells 111-11N which are not heavy formed yet. That is, by using N RRAM cells 111-11N, the option code OPC may be adjusted N times.

It should be noted, to adjust the option code OPC, the controller 120 may not perform the heavy forming operation on the RRAM cells 111-11N in sequential order. For example, the RRAM cell 112 may be heavy formed before the RRAM cell 111. The heavy forming operations may be respectively performed on the RRAM cells 111-11N in a random order.

Figure 2:
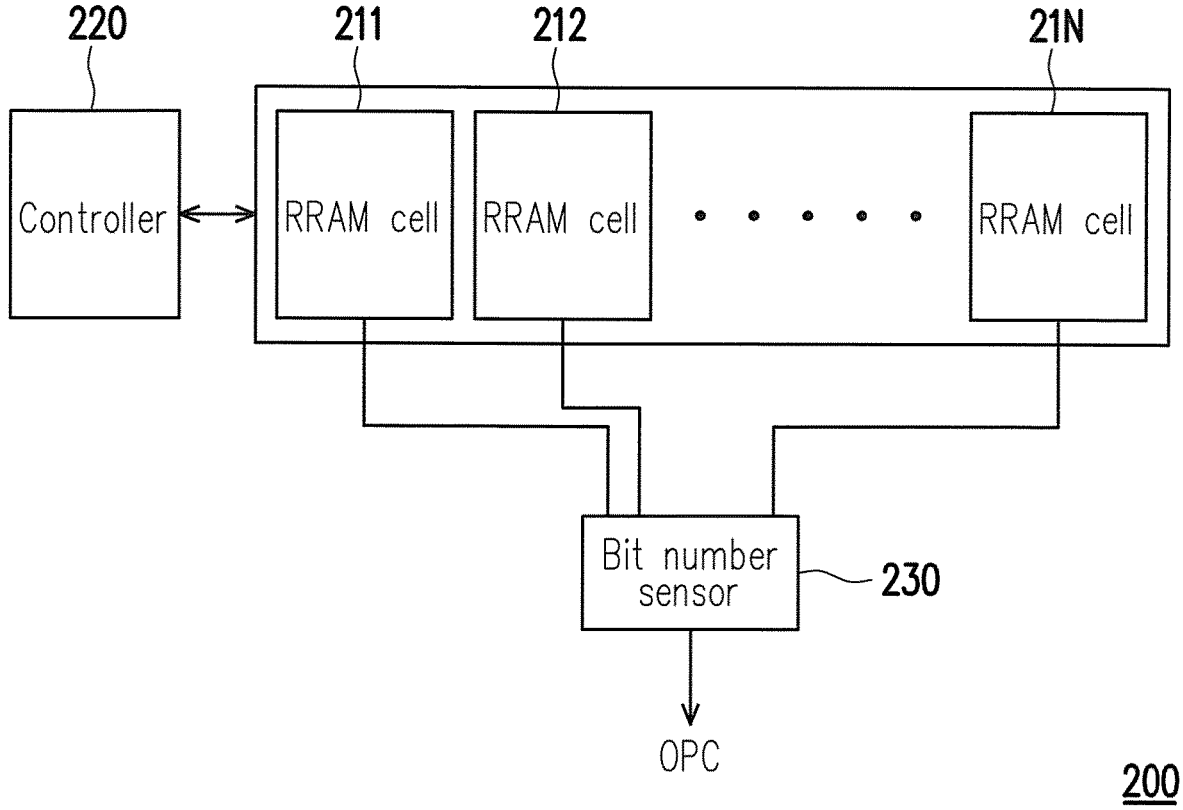
FIG. 2 illustrates a block diagram of the other option code providing circuit according to the other embodiment of present disclosure.

Referring to FIG. 2, FIG. 2 illustrates a block diagram of the other option code providing circuit according to the other embodiment of present disclosure. The option code providing circuit 200 includes a plurality of RRAM cells 211-21N, a controller 220, and a bit number sensor 230. The controller 220 is coupled to the plurality RRAM cells 211-21N, and the RRAM cells 211-21N are coupled to the bit number sensor 230. In this embodiment, the bit number sensor 230 has a plurality of input ends for connecting to bit lines of the RRAM cells 211-21N for reading a plurality stored data of the resistive random access memory cells 211-21N, respectively. The bit number sensor 230 may sense the bit number of the RRAM cells 211-21N which are heavy formed to generate the option code OPC according to the stored data of the resistive random access memory cells 211-21N. In detail, when a RRAM cell (for example, the RRAM cell 211) is heavy formed, the resistance of the RRAM cell 211 is reduce to a low value. When a read operation is operated on the heavy formed RRAM cell 211, a large current can be obtained, and the stored data in the RRAM cell 211 is transmitted to one of the input ends of the bit number sensor 230. That is, the bit number sensor 230 may sense the bit number of the RRAM cells 211-21N which are heavy formed, and generated the option code OPC accordingly. In one embodiment of present disclosure, the bit number sensor 230 may sense the bit number of the RRAM cells 211-21N which are heavy formed is odd or even to generate the option code OPC.

In other embodiments, the bit number sensor 230 may sense the bit number of the RRAM cells 211-21N which are not heavy formed, and generate the option code OPC. In another embodiment of the present disclosure, the bit number sensor 230 may sense bit number of the RRAM cells 211-21N which are not heavy formed is odd or even to generate the option code OPC.

Figure 3:
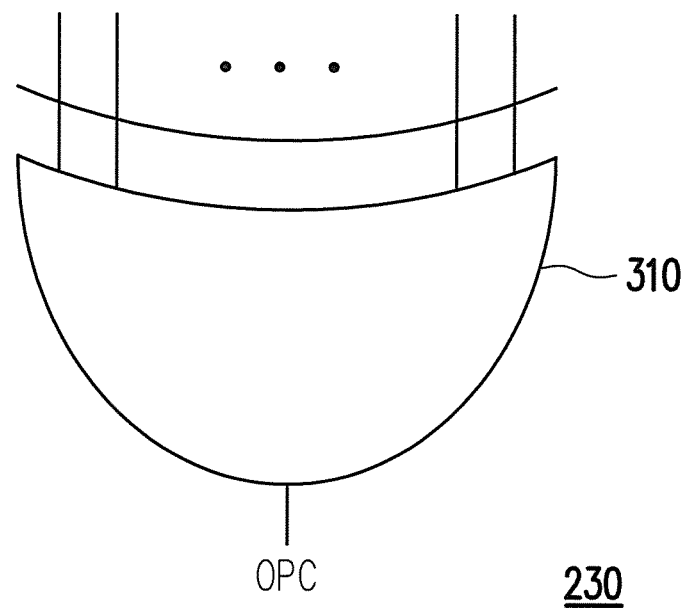
FIG. 3 illustrates a schematic diagram of the bit number sensor according to an embodiment of present disclosure.

Referring to FIG. 3, FIG. 3 illustrates a schematic diagram of the bit number sensor according to an embodiment of present disclosure. In FIG. 3, the bit number sensor 230 is a logic circuit, and the logic circuit may include a logic gate, and the logic circuit may be an XOR gate 310. The XOR gate 310 has a plurality of input ends for respectively coupling to the RRAM cells 211-21N. The XOR gate 310 may sense an amount of the logic value "1" on the input ends to generate the option code OPC.

Please be noted here, in another embodiment of present disclosure, the logic circuit may be another different gate, such as an XNOR gate. Or, the XOR gate can be implemented by the XOR gate 230 and an inverter coupled in series. There is no limitation to use XOR gate to implement the logic circuit of the bit number sensor 230.

Figure 4:
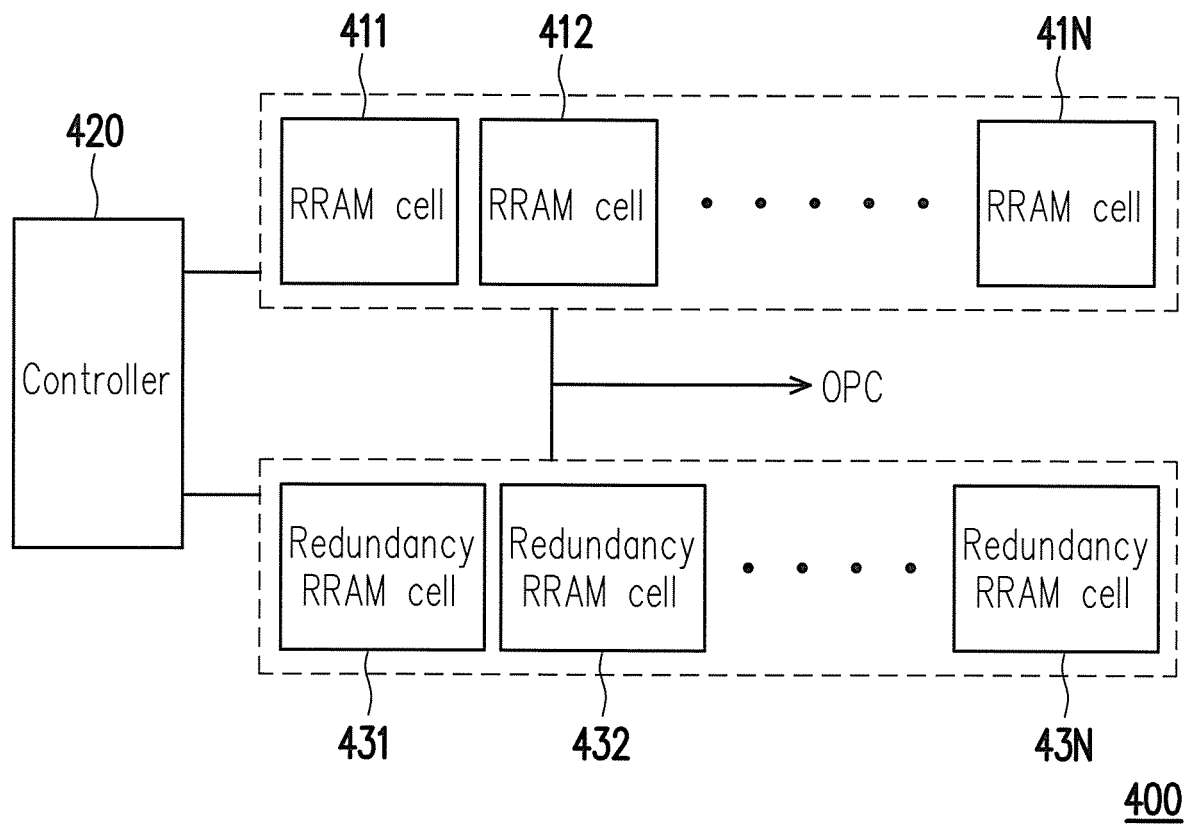
FIG. 4 illustrates a block diagram of another option code providing circuit according to another embodiment of present disclosure.

Referring to FIG. 4, FIG. 4 illustrates a block diagram of another option code providing circuit according to another embodiment of present disclosure. The option code providing circuit 400 includes a plurality of RRAM cells 411-41N, a plurality of redundancy RRAM cells 431-43N, and a controller 420. The controller 420 is coupled to the RRAM cells 411-41N and the redundancy RRAM cells 431-43N. The controller 420 may enable the RRAM cells 411-41N or the redundancy RRAM cells 431-43N to generate the option code OPC. If the RRAM cells 411-41N are used to provide the option code OPC, the redundancy RRAM cells 431-43N are disabled by the controller 420. On the contrary, if the redundancy RRAM cells 431-43N are used to provide the option code OPC, the RRAM cells 411-41N are disabled by the controller 420.

In detail, the controller 420 disables the redundancy RRAM cells 431-43N, and enable the RRAM cells 411-41N to provide the option code OPC during a first time period. During the first time period, the controller 420 generate the option code OPC according to a bit number of the heavy formed RRAM cells 411-41N. Furthermore, the controller 420 may provide a control signal to the RRAM cells 411-41N for heavy forming at least one of the RRAM cells 411-41N to adjust the option code OPC. If all of the RRAM cells 411-41N are heavy formed, and the option code OPC need to be further adjusted, the controlled 410 may disable the RRAM cells 411-41N and enable the redundancy RRAM cells 431-43N to generate the option code OPC during a second time period.

Additional, a number of the RRAM cells 411-41N and a number of the redundancy RRAM cells 431-43N may be same or may be different. And, in physical layout on a chip, the RRAM cells 411-41N and the redundancy RRAM cells 431-43N may be disposed one a same row or column.

In some embodiments of the disclosure, one or more groups of redundancy RRAM cells 431-43N may be implemented for providing the option code OPC. At most one of the groups of redundancy RRAM cells 431-43N and the group of the RRAM cells 411-41N is enabled, and the other groups are disable by the controller 420.

Figure 5:
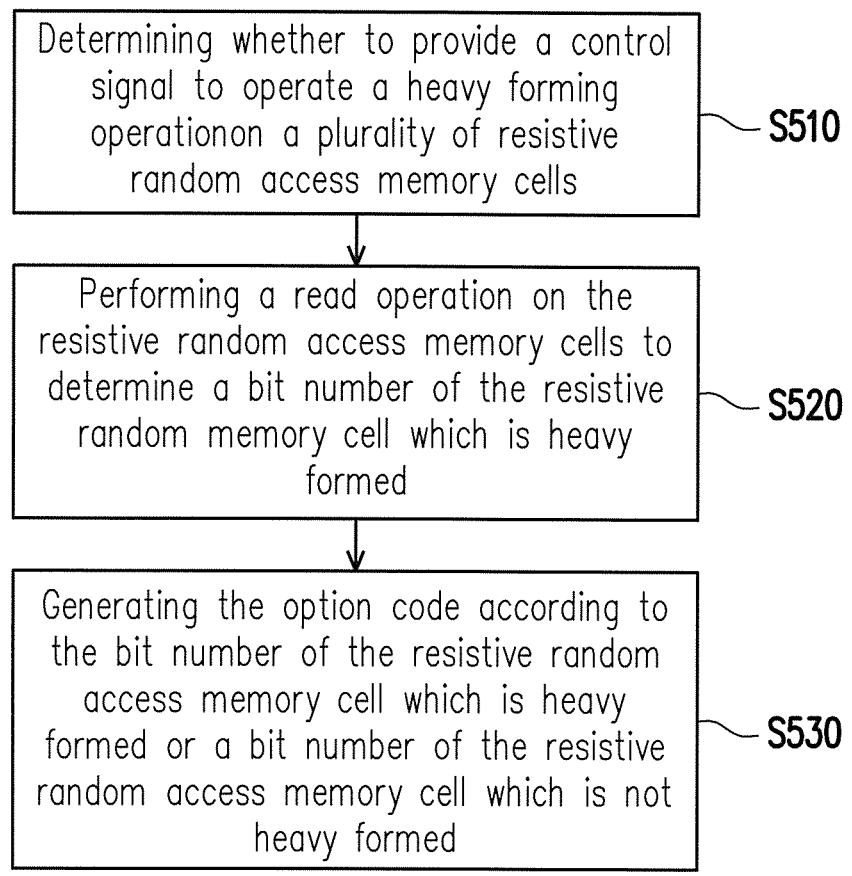
FIG. 5 illustrates a flow chart of step for an option code providing method according to an embodiment of present disclosure.

Referring to FIG. 5, FIG. 5 illustrates a flow chart of step for an option code providing method according to an embodiment of presented disclosure. In step S510, whether to provide a control signal to operate a heavy forming operation on a plurality of resistive random access memory cells is determined. Then, in step S520, a read operation is performed on the resistive random access memory cells to determine a bit number of the resistive random memory cell which is heavy formed. Finally, the option code is generated according to the bit number of the resistive random access memory cells which is heavy formed or a bit number of the resistive random access memory cells which is not heavy formed in step S530. Furthermore, the option code can be adjusted by executing the step S510-S530 once more, and an adjusted times of the option code may be determined by a total number of the resistive random access memory cells.

The details of the steps S510, S520 and S530 have been described in the embodiments mentioned above, and no more description repeated here.

The option code can be used to enable a specific function or application. Since data retention of the option code can be ensured, the specific function or application can be activated exactly.

In summary, the present disclosure provides a plurality of RRAM cells to be heavy formed, and the option code can be determined by the bit number which the RRAM cells are heavy formed. The heavy formed RRAM cells can't be recover, and the data retention requirement can be met, the performance of a system using the option code provider of present disclosure can be increased.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An option code providing circuit, comprising:
   a plurality of resistive random access memory cells;
   a controller, coupled to the resistive random access memory cells, operating a heavy forming operation on at least one of the resistive random access memory cells according to an option code to be adjusted, and performing a read operation on the resistive random access memory cells to determine a first bit number of the heavy formed resistive random access memory cell which is heavy formed;
   a bit number sensor, coupled to the resistive random access memory cells, generating the option code according to the first bit number of the resistive random access memory cell which is heavy formed or a second bit number of at least one un-heavy formed resistive random access memory cell,
   wherein the heavy forming operation is a one-time strong writing operation and the heavy formed resistive random memory cell is unrecoverable,
   wherein the controller performs heavy forming operation on at least one un-heavy formed resistive random access memory cells to provide the option code, and the controller re-performs heavy forming operation on another un-heavy formed resistive random access memory cell to update the option code; and
   a plurality of redundancy resistive random access memory cells, coupled to the controller,
   wherein, the controller disables the resistive random access memory cells when all of the resistive random access memory cells are heavy formed and enables at least one of the plurality of redundancy resistive random access memory cells to update the option code.

2. The option code providing circuit as claimed in claim 1, wherein if the first bit number of the at least one heavy formed resistive random access memory cell is odd, the bit number sensor generates the option code having a first logic value, and if the first bit number of the at least one heavy formed resistive random access memory cell is even, the bit number sensor generates the option code having a second logic value,
   wherein the first logic value is different from the second logic value.

3. The option code providing circuit as claimed in claim 1,
   wherein the bit number sensor reads a plurality stored data of the resistive random access memory cells respectively, and generates the option code according to the stored data.

4. The option code providing circuit as claimed in claim 3, wherein the bit number sensor is a logic circuit, and the logic circuit operates a logic operation on the plurality of stored data to generate the option code.

5. The option code providing circuit as claimed in claim 4, wherein the logic circuit comprises:
   an XOR gate, having a plurality of input ends respectively receiving the plurality of stored data, and an output end to generate the option code.

6. The option code providing circuit as claimed in claim 3, wherein each of the stored data is obtained according to a resistance of corresponding resistive random access memory cell.

7. An option code providing method, comprising:
   operating a heavy forming operation on at least one of the resistive random access memory cells according to an option code to be adjusted by a controller;
   performing a read operation on the resistive random access memory cells by the controller to determine a first bit number of the resistive random access memory cell which is heavy formed;
   generating the option code according to the first bit number of the resistive random access memory cell by a bit number sensor which is heavy formed or a second bit number of the resistive random access memory cell which is not heavy formed;
   performing heavy forming operation on at least one un-heavy formed resistive random access memory cells to provide the option code by the controller;
   re-performing heavy forming operation on another un-heavy formed resistive random access memory cells to update the option code by the controller,
   wherein the heavy forming operation is a one-time strong writing operation and the heavy formed resistive random dom memory cell is unrecoverable; and
   providing a plurality of redundancy resistive random access memory cells; and
   disabling the resistive random access memory cells when all of the resistive random access memory cells are heavy formed and enabling at least one of the plurality of redundancy resistive random access memory cells to update the option code.

8. The option code providing method according to claim 7, wherein step of generating the option code according to the first bit number of the resistive random access memory cell which is heavy formed comprises:
   if the first bit number is odd, generating the option code having a first logic value, and if the first bit number is even, generating the option code having a second logic value, and the first logic value is different from the second logic value.

9. The option code providing method according to claim 7, wherein step of generating the option code according to the first bit number of the resistive random access memory cell which is heavy formed comprises:

reading a plurality stored data of the resistive random access memory cells respectively, and generating the option code according to the stored data.

10. The option code providing method according to claim 9, wherein step of generating the option code according to the stored data comprises:

operating a logic operation on the plurality of stored data to generate the option code.

11. An option code providing circuit, comprising:

a plurality of resistive random access memory cells; and a controller, coupled to the resistive random access memory cells, operating a heavy forming operation on at least one of the resistive random access memory cells according to an option code to be adjusted, and performing a read operation on the resistive random access memory cells to determine a first bit number of the heavy formed resistive random access memory cell which is heavy formed; and a bit number sensor, coupled to the resistive random access memory cells, generating the option code according to the first bit number of the resistive random access memory cell which is heavy formed or a second bit number of at least one un-heavy formed resistive random access memory cell, wherein the heavy forming operation is a one-time strong writing operation and the heavy formed resistive random memory cell is unrecoverable;

a plurality of redundancy resistive random access memory cells, coupled to the controller, wherein, the controller disables the resistive random access memory cells when all of the resistive random access memory cells are heavy formed and forms at least one of the plurality of redundancy resistive random access memory cells to update the option code, wherein during a first period, the controller disables the redundancy resistive random access memory cells and enables the heavy formed resistive random access me ivory cells to provide the option code, wherein during a second period, the controller disables the heavy formed resistive random access memory cells and enables the redundancy resistive random access memory cells to provide the option code.

* * * * *